(12) United States Patent
Peng et al.

(10) Patent No.: US 12,264,029 B1
(45) Date of Patent: Apr. 1, 2025

(54) ADHESIVE TAPE TEARING MODULE FOR DOUBLE-GLASS ASSEMBLY, AND ADHESIVE TAPE TEARING MACHINE

(71) Applicant: SUZHOU SC-SOLAR EQUIPMENT CO., LTD, Suzhou (CN)

(72) Inventors: Haijun Peng, Suzhou (CN); Xing Yang, Suzhou (CN); Xuejin Hu, Suzhou (CN)

(73) Assignee: SUZHOU SC-SOLAR EQUIPMENT CO., LTD, Suzhou (CN)

( * ) Notice: Subject to any disclaimer, the term of this patent is extended or adjusted under 35 U.S.C. 154(b) by 0 days.

(21) Appl. No.: 18/729,406

(22) PCT Filed: Sep. 6, 2023

(86) PCT No.: PCT/CN2023/117139
§ 371 (c)(1),
(2) Date: Jul. 16, 2024

(87) PCT Pub. No.: WO2024/087894
PCT Pub. Date: May 2, 2024

(30) Foreign Application Priority Data

Oct. 26, 2022 (CN) .......................... 202211317935.3

(51) Int. Cl.
*B65H 35/00* (2006.01)
*B65H 37/00* (2006.01)
(52) U.S. Cl.
CPC ......... *B65H 35/0013* (2013.01); *B65H 37/00* (2013.01); *B65H 2701/377* (2013.01)

(58) Field of Classification Search
CPC .............. B65H 2701/377; B65H 37/00; B65H 35/0013; C09J 2301/302; C09J 2400/24; C09J 123/283
See application file for complete search history.

(56) References Cited

FOREIGN PATENT DOCUMENTS

| CN | 106024997 A | 10/2016 |
| CN | 210362895 U | 4/2020 |
| CN | 113830386 A | 12/2021 |
| CN | 215096255 U | 12/2021 |

(Continued)

OTHER PUBLICATIONS

Machine translation of CN 215096260 U (Year: 2021).*

(Continued)

*Primary Examiner* — Vishal I Patel
(74) *Attorney, Agent, or Firm* — Taft Stettinius & Hollister LLP

(57) ABSTRACT

An adhesive tape tearing module for a double-glass assembly and an adhesive tape tearing machine are provided. The adhesive tape tearing module includes an adhesive tape tearing assembly. The adhesive tape tearing assembly includes a second transfer driving assembly and a second support plate driven by the second transfer driving assembly to move front and back. A remnant smoothing mechanism is arranged on the second support plate and is configured to flatten an adhesive tape remnant in a direction from inward to outward of a photovoltaic assembly. The remnant smoothing mechanism includes a first cylinder and smoothing clamping plates which are driven by the first cylinder to perform up-down clamping and have an up-down elastic floating function.

16 Claims, 9 Drawing Sheets

(56) References Cited

FOREIGN PATENT DOCUMENTS

| | | |
|---|---|---|
| CN | 215096260 U | 12/2021 |
| CN | 216268088 U | 4/2022 |
| CN | 114955672 A | 8/2022 |
| CN | 115376985 A | 11/2022 |
| CN | 218182231 U | 12/2022 |

OTHER PUBLICATIONS

International Search Report and Written Opinion; China National Intellectual Property Administration; International Application No. PCT/CN2023/117139; Nov. 20, 2023; 20 pages.

First Office Action; The State Intellectual Property Office of People's Republic of China; Chinese Patent Appl. No. 202211317935.3; Nov. 19, 2022; 11 pages.

* cited by examiner

ADHESIVE TAPE TEARING MODULE FOR DOUBLE-GLASS ASSEMBLY, AND ADHESIVE TAPE TEARING MACHINE

CROSS REFERENCE TO RELATED APPLICATIONS

This application is a National Stage Application filed under 35 U.S.C. 371 based on International Patent Application No. PCT/CN2023/117139 filed on Sep. 6, 2023, which claims priority to Chinese Patent Application No. 202211317935.3 filed on Oct. 26, 2022, the disclosures of which are incorporated herein by reference in their entireties.

TECHNICAL FIELD

The present application relates to the technical field of photovoltaic assembly adhesive tape tearing, for example, to an adhesive tape tearing module for a double-glass assembly and an adhesive tape tearing machine.

BACKGROUND

In the production process of photovoltaic assembly, a laminator is required to press the layers of substances including glass, EVA, battery cells, EVA and backsheet together. Before lamination, in order to ensure the installation position of the various components of the photovoltaic assembly, adhesive tapes ire usually pasted on the four sides of the photovoltaic assembly before the photovoltaic assembly enter the laminator. After the lamination is completed, the adhesive tapes used for shape fixing are required to be torn off.

In the related technology, the patent publication No. CN215096255U discloses a new-type adhesive tape tearing mechanism for a double-glass photovoltaic assembly, the adhesive tape tearing mechanism integrates an adhesive tape tearing clamp and a material receiving clamp to perform adhesive tape tearing and collecting and adhesive tape taking down and discharging actions. However, the adhesive tape tearing clamp is driven by a cylinder, and at the moment of clamping the adhesive tape remnant to tear the adhesive tape, the instantaneous pulling force applied on the adhesive tape is too large, increasing the risk of the adhesive tape being broken. Moreover, in this mechanism, when clamping the adhesive tape remnant, the adhesive tape tearing clamp moves directly to a set position, generally the periphery of an end of a lateral side, and then directly performs a clamping action. However, generally, the adhesive tape wrapped on the side of the photovoltaic assembly has a remnant extending out by a certain length from the side of the assembly, the curling state of the extended part is not certain, and it may be skewed or cocked in various directions. Therefore, if the clamping action is performed directly, it is very likely that the clamp jaws will not clamp the adhesive tape remnant. If the clamping jaws do not clamp the adhesive tape remnant, effective tearing cannot be performed, resulting in failure of tearing off of the adhesive tape.

In the related technology, the Patent publication No. CN113830386A discloses an automatic adhesive tape tearing apparatus. An adhesive tape tearing clamp and a material receiving clamp are separately provided in the automatic adhesive tape tearing apparatus, and the adhesive tape tearing clamp is driven by a motor to perform the tearing action. Compared with the above cylinder solution, it can cooperate with a lateral transfer mechanism to implement curved actions for adhesive tape tearing, which can reduce the adhesive tape tearing pulling force and solve the problem of adhesive tape breakage caused by excessive instantaneous tearing pulling force. However, the adhesive tape tearing clamp in this apparatus still performs a direct clamping action, and still fails to accurately or effectively clamp the adhesive tape remnant. The design still has a risk of failure in tearing off an adhesive tape, and is not adapted to the adhesive tape tearing of assembly with different adhesive tape states.

SUMMARY

An adhesive tape tearing module for a double-glass assembly is provided according to an embodiment of the present application. The adhesive tape tearing module for a double-glass assembly is adapted to adhesive tape remnant in various postures and can perform effective and reliable automatic adhesive tape tearing actions.

An adhesive tape tearing module for a double-glass assembly is provided according to the present application, which includes an adhesive tape tearing assembly. The adhesive tape tearing assembly includes a second transfer driving assembly and a second support plate driven by the second transfer driving assembly to move front and back. A remnant smoothing mechanism is disposed on the second support plate and is configured to flatten an adhesive tape remnant in a direction from inward to outward of a photovoltaic assembly. The remnant smoothing mechanism includes a first cylinder and smoothing clamping plates which are driven by the first cylinder to perform up-down clamping and have an up-down elastic floating function.

An adhesive tape tearing machine for a double-glass assembly is further provided according to the present application, and the adhesive tape tearing machine includes the adhesive tape tearing module for a double-glass assembly described above.

REFERENCE NUMERALS

100—adhesive tape tearing module for a double-glass assembly
101—photovoltaic assembly
102—adhesive tape remnant
1—adhesive tape tearing assembly
11—second transfer driving assembly
12—second support plate
13—remnant smoothing mechanism
131—first cylinder
132—elastic clamp
1321—mounting plate
1322—elastic member
1323—smoothing clamping plate
1324—connecting rod
1325—stop ring
14—material clamping mechanism
141—fixed clamping plate
142—movable hook rod
143—second cylinder
144—sensor fixing block
145—sensor
146—rear side baffle
147—guide vertical plate
148—first slide rail
149—first slide plate
1410—second slide rail
1411—second slide plate
1412—cam
1413—guide slide groove
1414—clamping claw cylinder
1415—clamping claw
2—first transfer driving assembly
3—material collecting assembly
31—third cylinder
32—third support plate
33—rotating plate
34—rotation driving member
35—adhesive tape supporting and winding mechanism
351—fixed support plate
352—movable support plate
353—fourth cylinder
354—material clamping plate
355—fifth cylinder
36—adhesive tape removing and discharging mechanism
361—sixth cylinder
362—adhesive tape removing scraper
4—first support plate
5—third transfer driving assembly
200—adhesive tape tearing machine for a double-glass assembly

DETAILED DESCRIPTION

Embodiment One

Figure 1A:
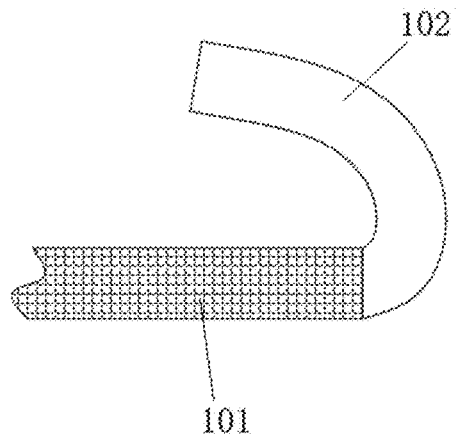
FIG. 1A-1D are schematic structural diagrams of adhesive tape remnants on sides of a photovoltaic assembly in four postures of upward curling and downward curling as viewed from the side.
Figure 1B:
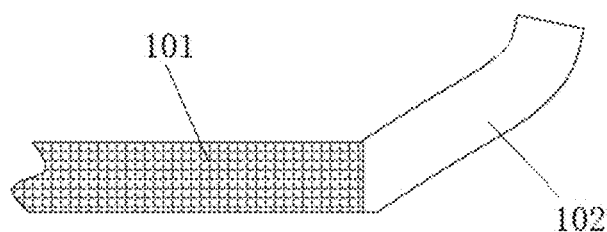
Figure 1C:
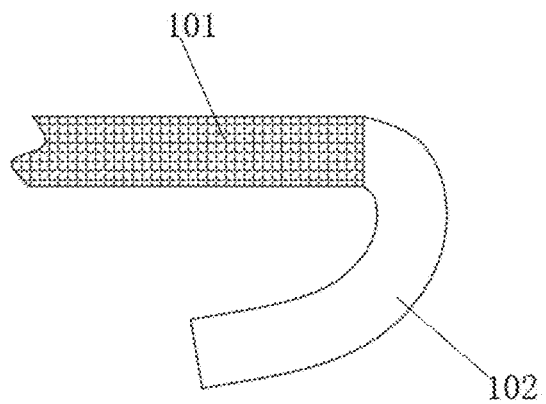
Figure 1D:
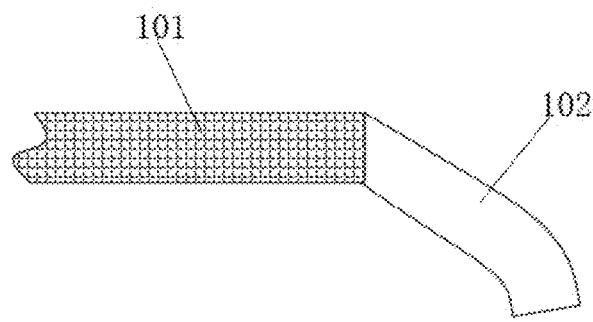
Figure 2A:
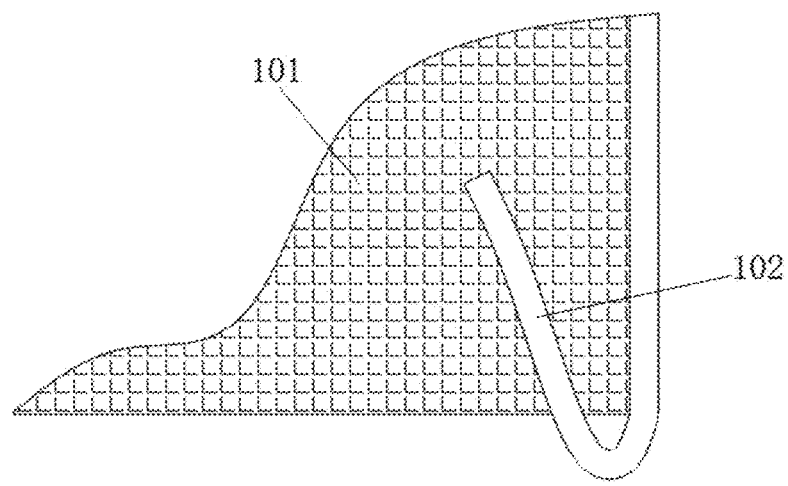
FIG. 2A-2D are schematic structural diagrams of adhesive tape remnants on sides of a photovoltaic assembly in four postures of upward curling and downward curling as viewed from the top.
Figure 2B:
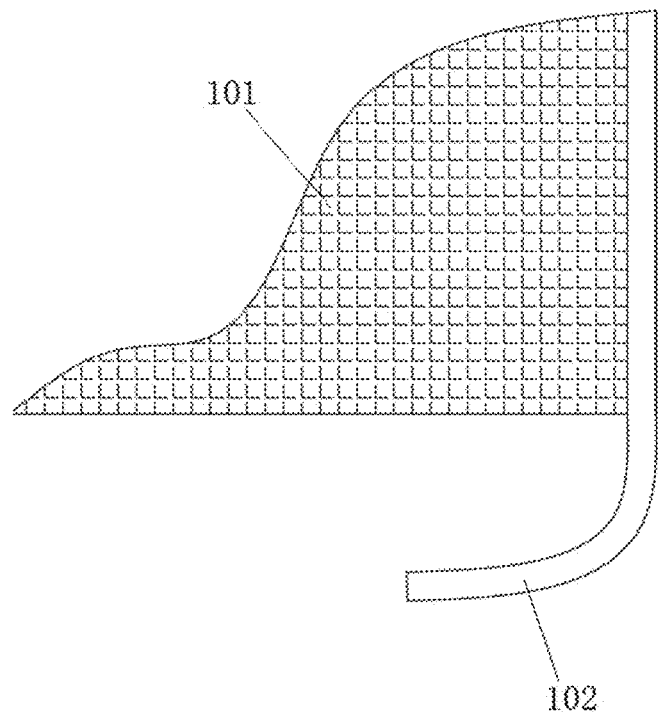
Figure 2C:
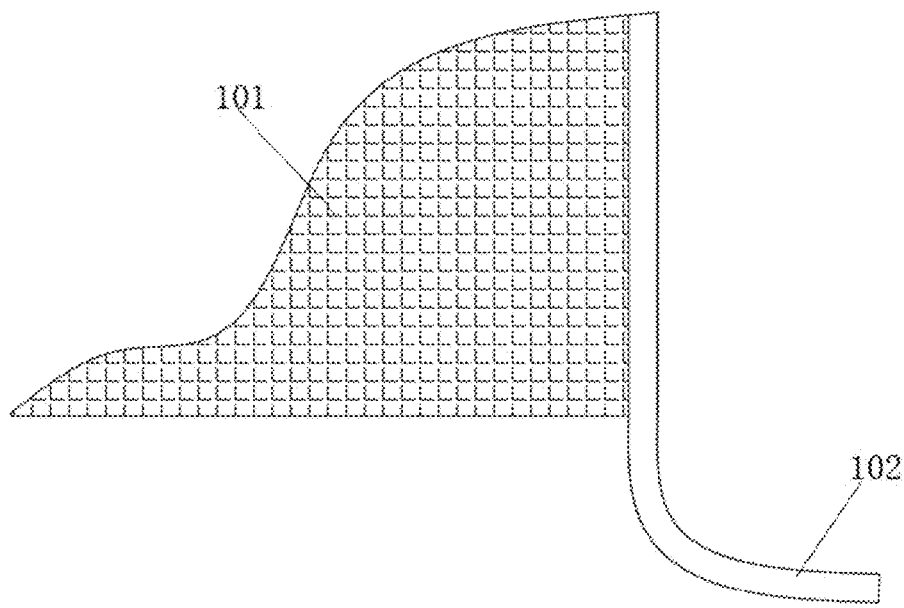
Figure 2D:
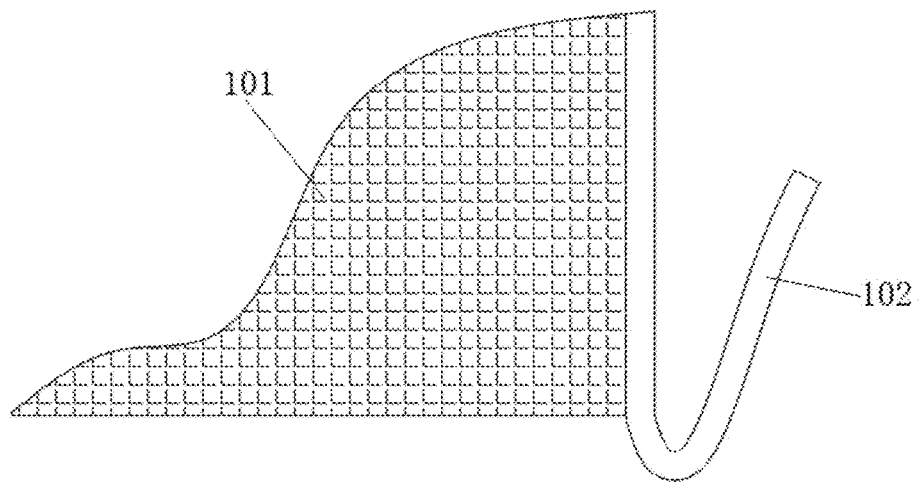
Figure 3:
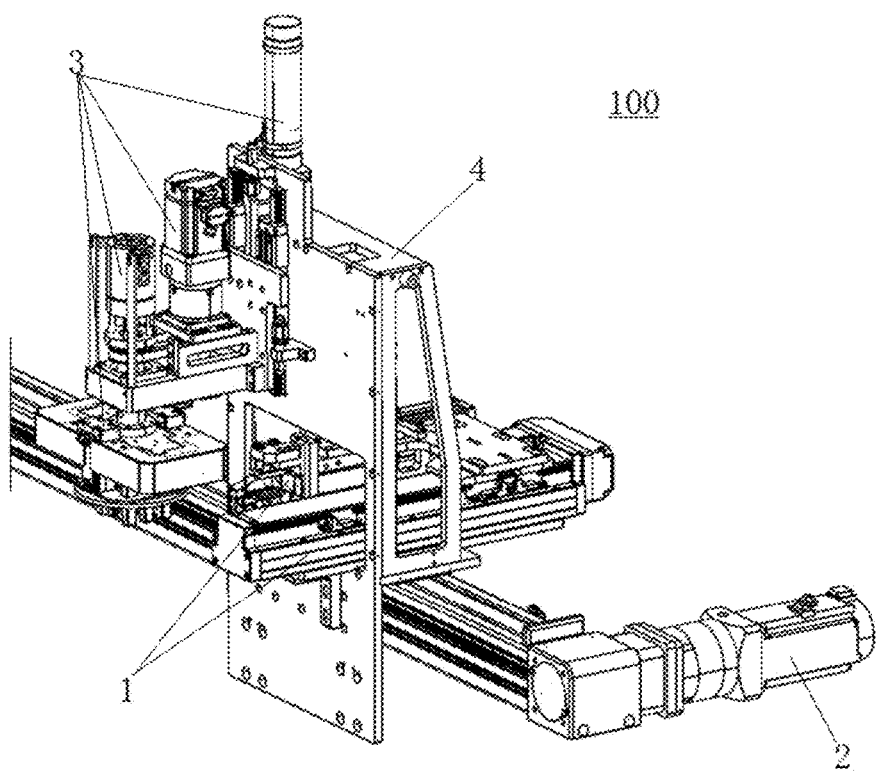
FIG. 3 is a schematic structural diagram of an adhesive tape tearing module for a double-glass assembly in embodiments of the present application.

Reference is made to FIG. 3, the embodiments provide an adhesive tape tearing module for a double-glass assembly 100. The adhesive tape tearing module for a double-glass assembly 100 includes an adhesive tape tearing assembly 1, a first transfer driving assembly 2 and a material receiving assembly 3. The adhesive tape tearing assembly 1 and the material receiving assembly 3 are arranged on a first support plate 4. The first support plate 4 is arranged at a movable end of the first transfer driving assembly 2. The adhesive tape tearing assembly 1 and the material receiving assembly 3 are driven by the first transfer driving assembly 2 to move left and right.

Reference is made to FIG. 1A to FIG. 1D and FIG. 2A to FIG. 2D. The adhesive tape at the end of the photovoltaic assembly 101 may have various postures, for example, the adhesive tape remnant 102 is bent toward the inside of the photovoltaic assembly 101. There are also various postures for the bending toward the inside of the photovoltaic assembly 101, such as inward and upward curling or inward and downward curling, or inward and forward curling or inward and backward curling, as shown in FIG. 1A to FIG. 1D. For another example, the adhesive tape remnant 102 is bent toward the outside of the photovoltaic assembly 101. There are also various postures for the bending toward the outside of the photovoltaic assembly 101, such as outward and upward curling or outward and downward curling, or outward and forward curling or outward and backward curling, as shown in FIG. 2A to FIG. 2D. Illustratively, there are a total of eight major posture categories.

Figure 4:
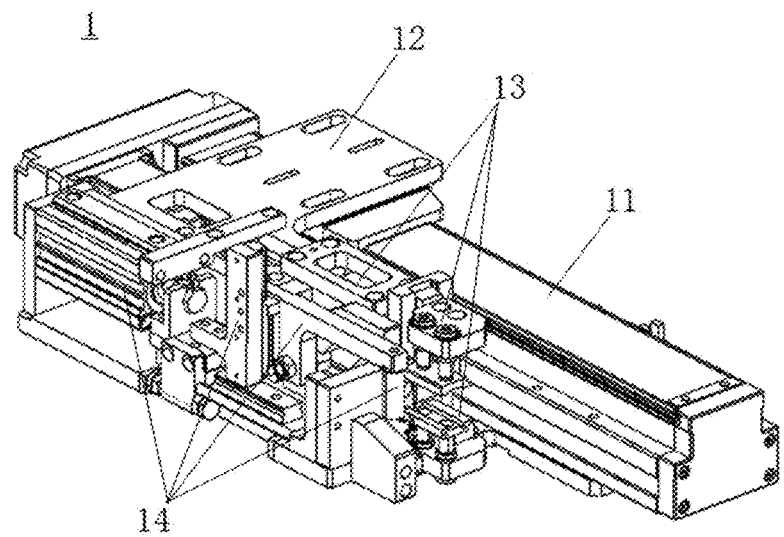
FIG. 4 is a schematic structural diagram of an adhesive tape tearing assembly in embodiments of the present application.

Referring to FIG. 4, the adhesive tape tearing assembly 1 includes a second transfer driving assembly 11 and a second support plate 12. The second support plate 12 is configured to be driven by the second transfer driving assembly 11 to move forward and backward.

In order to be adapted to the precise clamping of the adhesive tape remnants 102 in four postures, namely, inward and upward curling, inward and downward curling, outward and upward curling, and outward and downward curling, a remnant smoothing mechanism 13 is disposed on the second support plate 12 in the embodiments, for smoothing the adhesive tape remnant 102 in a direction from inward to outward of the photovoltaic assembly 101.

Figure 5:
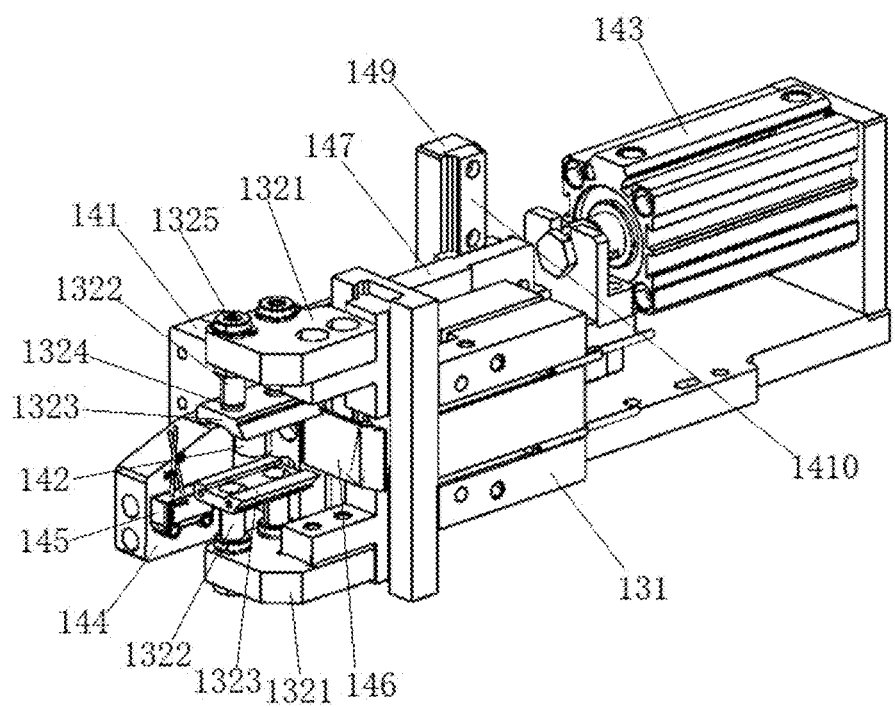
FIG. 5 is a schematic structural diagram of a remnant smoothing mechanism and a material clamping mechanism in embodiments of the present application.
Figure 7:
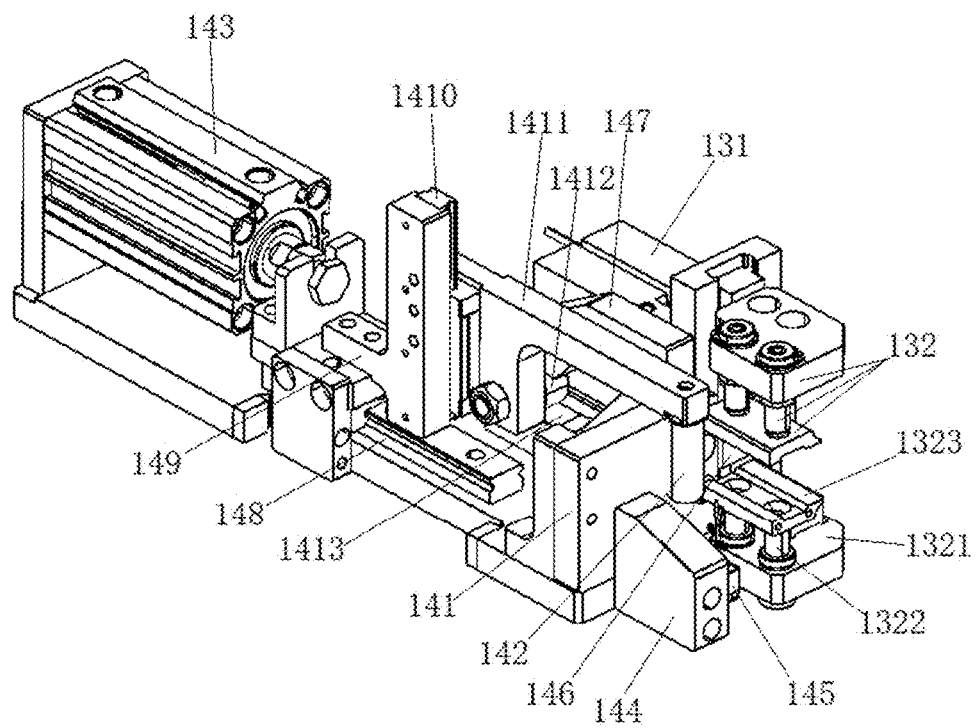
FIG. 7 is a schematic structural diagram of a remnant smoothing mechanism and a material clamping mechanism in another view in embodiments of the present application.

Reference is made to FIG. 5 and FIG. 7, the remnant smoothing mechanism 13 includes a first cylinder 131 and an elastic clamp 132. The elastic clamp 132 is driven by the first cylinder 131 to perform up-down clamping or opening. The elastic clamp 132 includes a mounting plate 1321 fixed to a movable end of the first cylinder 131 and two smoothing clamping plates 1323. The two smoothing clamping plates 1323 are arranged on the mounting plate 1321 to float up and down through an elastic member 1322. The smoothing clamping plates 1323 have the capability to float up and down elastically on the mounting plate 1321. Optionally, a connecting rod 1324 is fixedly disposed on a smoothing clamping plate 1323, one end of the connecting rod 1324 passes through the mounting plate 1321, the elastic member 1322 is sleeved on the connecting rod 1324 and supports the smoothing clamping plate 1323 in the clamping direction. A stop ring 1325 is disposed on an end of the connecting rod 1324 extending out of the surface of the mounting plate 1321 to prevent the connecting rod 1324 from being detached from the mounting plate 1321.

Before clamping the adhesive tape remnant, the two smoothing clamping plates 1323 in the remnant smoothing mechanism 13 remain in an open state. The second transfer driving assembly 11 drives the remnant smoothing mechanism 13 to extend to the photovoltaic assembly 101, and the two smoothing clamping plates 1323 are located at upper and lower sides of a lateral side of the photovoltaic assembly

101. The first cylinder 131 drives the two smoothing clamping plates 1323 to clamp, and the two smoothing clamping plates 1323 clamp against the upper and lower surfaces of the lateral side of the photovoltaic assembly 101. Since the smoothing clamping plates 1323 have an up-down elastic floating function, they will not damage the photovoltaic assembly 101 in clamping it and can maintain to apply a set holding force to the lateral side of the photovoltaic assembly 101. The set holding force can be flexibly adjusted by adjusting the compression amount of the elastic member 1322. Driven by the first transfer driving assembly 2, the remnant smoothing mechanism 13 is moved from inward to outward of the photovoltaic assembly 101 along an edge on one side of the photovoltaic assembly 101. The remnant that is curled upward or downward toward the inside of the photovoltaic assembly 101 can be effectively flattened to a set horizontal height position, and the remnant that is curled upward or downward toward the outside of the photovoltaic assembly 101 can also be flattened to a set horizontal height position, thereby correcting the position of the adhesive tape remnant 102 to eliminate the remnant posture that is not conducive to clamping the remnant.

Reference is made to FIG. 5 and FIG. 7, the remnant smoothing mechanism 13 is adaptable to the upward curved adhesive tape remnant 102 or the downward curved adhesive tape remnant 102. In the case where the adhesive tape remnant 102 is curled forward or backward, the smoothing clamping plate 1323 may not effectively correct its position. Therefore, for the adhesive tape remnants 102 in these postures, there is still a case where the adhesive tape remnants 102 cannot be clamped, resulting in failure of adhesive tape tearing. Therefore, in order to solve this problem, in this embodiment, a material clamping mechanism 14 is further disposed on the second support plate 12 and is located next to the remnant smoothing mechanism 13. The material clamping mechanism 14 is configured to hook the adhesive tape remnant to the set position and clamp it. In the direction of adhesive tape tearing, the material clamping mechanism 14 is located downstream of the remnant smoothing mechanism 13. After the remnant smoothing mechanism 13 moves to the outside of the photovoltaic assembly 101, the material clamping mechanism 14 performs the material hooking and clamping actions.

Reference is made to FIG. 5 and FIG. 7, the material clamping mechanism 14 includes a fixed clamping plate 141 fixed on the second support plate 12, a movable hook rod 142 arranged opposite to the fixed clamping plate 141, and a second cylinder 143 that drives the movable hook rod 142 to move forward and backward to hook the material and cooperate with the fixed clamping plate 141 to clamp the material. Before the remnant smoothing mechanism 13 flattens the remnant, the movable hook rod 142 is in an extended state. When the movable hook rod 142 moves to the outside of the photovoltaic assembly 101, the second cylinder 143 drives the movable hook rod 142 to retract, straighten the adhesive tape remnant and clamp the adhesive tape through the fixed clamping plate 141. The adhesive tape pulling action of the movable hook rod 142 can solve the problem of difficulty in accurately clamping the remnant in the posture of being curled outward and forward. For the remnant in a posture of inward and forward curling, it can be flattened to a posture of outward curling by two smoothing clamping plates 1323 first, and then the adhesive tape can be pulled back from the front side to a set position by the movable hook rod 142 for effective and reliable clamping, thereby being adapted to the clamping of the "remnant in the posture of forward curling", as shown in the two postures of inward and forward curling and outward and forward curling in FIG. 2A and FIG. 2B.

In order to monitor whether the material clamping mechanism 14 has pulled the adhesive tape and ensure that the adhesive tape tearing process is stable and reliable, a sensor fixing block 144 is disposed on the fixed clamping plate 141, and a sensor 145 is fixedly disposed on the sensor fixing block 144. The sensor 145 is configured to detect whether the movable hook rod 142 has pulled the adhesive tape successfully. The movable hook rod 142 and the fixed clamping plate 141 clamp the adhesive tape remnant 102. The second transfer driving assembly 11 and the first transfer driving assembly 2 cooperate to drive the material clamping mechanism 14 to perform gentle adhesive tape tearing action like a human. At this time, the material clamping mechanism 14 has been away from the side of the photovoltaic assembly 101 for a certain distance. If the material clamping mechanism 14 successfully clamps the material, the sensor 145 can continue to sense the signal. If the material clamping mechanism 14 fails to clamp the material, the sensor 145 fails to sense the signal and an alarm is issued.

Among the eight possible postures of adhesive tape remnants, the design of structures of the remnant smoothing mechanism 13 and the material clamping mechanism 14 can be adapted to reliable clamping of six remnant postures. There are still two postures, "inward and backward curling" and "outward and backward curling", which are not correctable through the design. The main problem of these two postures is backward curling. In order to solve this problem, in this embodiment, a rear side baffle 146 is disposed at a rear of a region between the upper and lower smoothing clamping plates 1323. The rear side baffle 146 is fixedly disposed on a side surface of the fixed clamping plate 141 and extends outward at the rear of the region between the two smoothing clamping plates 1323. The rear side baffle 146 has an inclined introduction surface formed at one end thereof. In the process of smoothing the remnant, the backward curled remnant can be guided forward and corrected into the clamping range of the smoothing clamping plates 1323 through the rear side baffle 146, thereby performing effective posture correction to facilitate material hooking of the movable hook rod 142.

Figure 6:
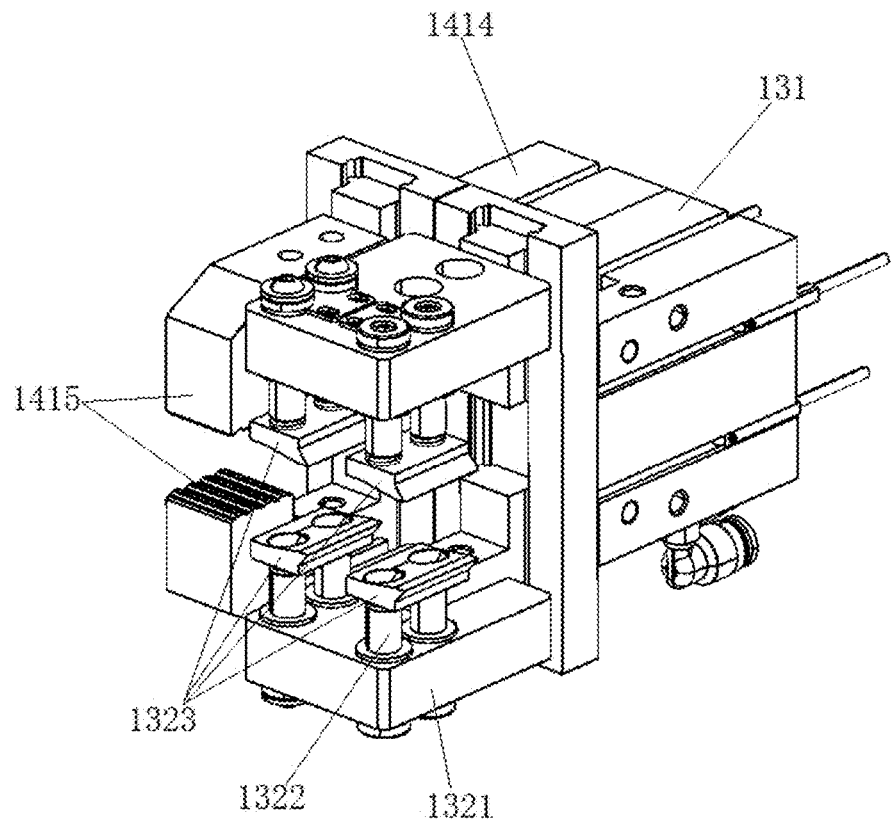
FIG. 6 is a schematic structural diagram of a remnant smoothing mechanism and a material clamping mechanism in other embodiments of the present application.

Through the structural design of the remnant smoothing mechanism 13, the material clamping mechanism 14 and the rear side baffle 146 described above, accurate and reliable clamping of remnants in all conventional postures can be achieved, thereby ensuring stable and reliable remnant tearing. In this embodiment, the three components of the remnant smoothing mechanism 13, the material clamping mechanism 14 and the rear side baffle 146 are integrated together, thereby realizing the correction of the adhesive tape remnants 102 in eight postures. In other embodiments, the remnant smoothing mechanism 13 may also be used in combination with a conventional material clamping mechanism. The material clamping mechanism 14 may include a clamping claw cylinder 1414 and clamping claws 1415 driven by the clamping claw cylinder 1414 to perform up-down clamping and opening actions. As shown in FIG. 6, the material clamping mechanism 14 uses the clamping claw cylinder 1414 to drive the up-down clamping claws 1415 to clamp the adhesive tape. The remnant smoothing mechanism 13 is arranged next to the material clamping mechanism 14, and can be adapted to the correction of the adhesive tape remnants 102 in four postures; and the rear side baffle 146 may further be added on this basis to be adapted to the correction of the adhesive tape remnants 102 in six postures.

Reference is made to FIG. 7. In order to save power source, reduce the number of components and simplify the module structure, one driving force source, that is, the second cylinder 143, is provided in this embodiment to realize the up-down and forward-backward movement of the movable hook rod 142. Optionally, a guide vertical plate 147 and a first slide rail 148 are fixedly disposed on the second support plate 12. The first slide rail 148 is arranged horizontally from front to back. A first slide plate 149 is disposed on the first slide rail 148, and a piston end of the second cylinder 143 is connected to the first slide plate 149. A second slide rail 1410 arranged vertically is disposed on the first slide plate 149, and a second slide plate 1411 is disposed on the second slide rail 1410. A cam 1412 is disposed on the second slide plate 1411, the guide vertical plate 147 is provided with a guide slide groove 1413 for the cam 1412 to move up and down, and the cam 1412 extends into the guide slide groove 1413. The movable hook rod 142 is fixed at a front end of the second slide plate 1411 and is located at a front side of the fixed clamping plate 141. The first slide plate 149 is driven to move forward and backward by the second cylinder 143, and the second slide plate 1411 can be guided by the guide slide groove 1413 to move up and down. In this manner, the movable hook rod 142 is at the upper limit height position when it is extended inward of the photovoltaic assembly 101, avoiding interference with the photovoltaic assembly 101, and then when the movable hook rod 142 retracts to pull the material, the movable hook rod 142 moves backward and downward, so that the bottom of the movable hook rod 142 can be lower than the bottom of the adhesive tape by a certain length, so as to effectively pull the material.

In an embodiment, the material receiving assembly 3 is arranged on the first support plate 4 and is located above a front side of the adhesive tape tearing assembly 1; or, the material receiving assembly 3 is driven by a third transfer driving assembly 5 to move left and right. When it is required to change the length and width of the assembly, the position of the apparatus can be quickly adjusted through the third transfer driving assembly 5, and can be switched with one click, which saves time and efforts.

Figure 8:
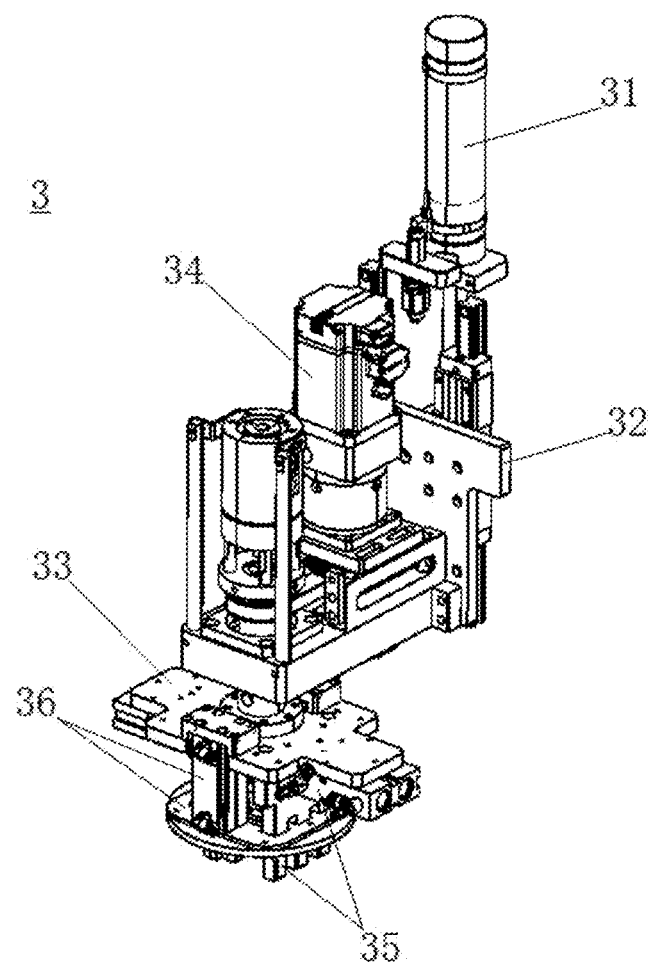
FIG. 8 is a schematic structural diagram of a material receiving assembly in embodiments of the present application.
Figure 10:
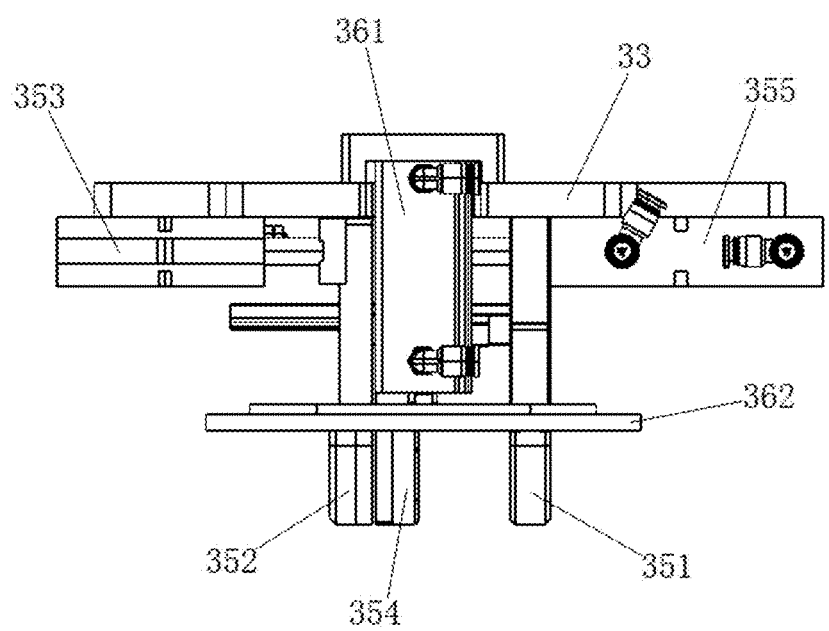
FIG. 10 is a schematic structural diagram of an adhesive tape supporting and winding mechanism and an adhesive tape removing and discharging mechanism in embodiments of the present application.

Reference is made to FIG. 8 and FIG. 10. After the adhesive tape tearing assembly 1 tears off the adhesive tape remnant 102 at the end of the photovoltaic assembly 101, the material receiving assembly 3 is responsible for the subsequent tearing, collecting and discharging of the adhesive tape on the main part of the side of the photovoltaic assembly 101. Optionally, the material receiving assembly 3 includes a third cylinder 31 fixed on the first support plate 4, a third support plate 32 driven by the third cylinder 31 to move up and down, a rotating plate 33 arranged on the third support plate 32 through a rotating shaft, a rotation driving member 34 driving the rotating plate 33 to rotate, an adhesive tape supporting and winding mechanism 35 fixed on the rotating plate 33, and an adhesive tape removing and discharging mechanism 36 fixed on the rotating plate 33.

Figure 9:
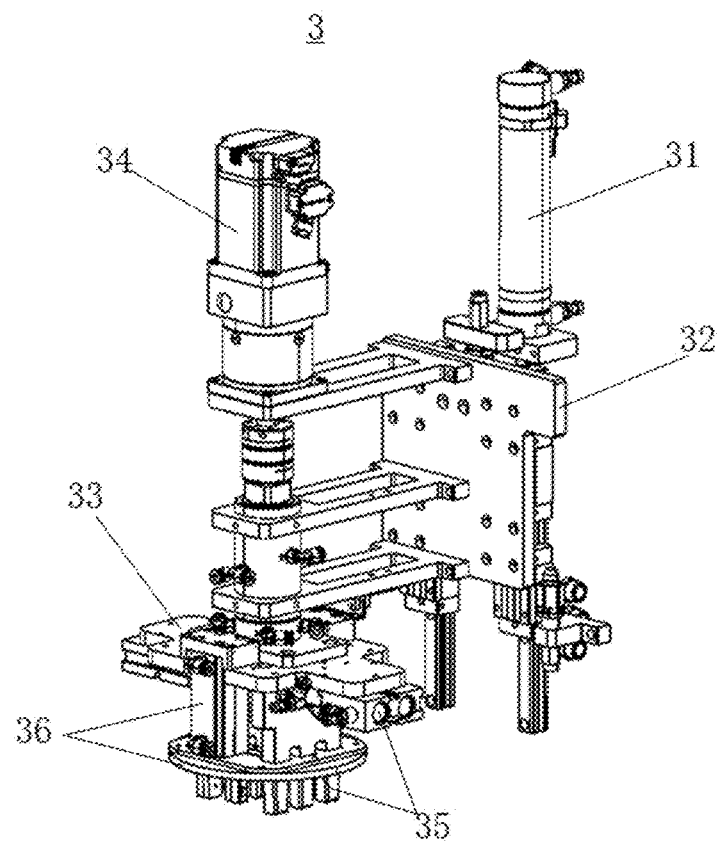
FIG. 9 is a schematic structural diagram of a material receiving assembly in other embodiments of the present application.

In this embodiment, the rotation driving member 34 drives the rotation of the rotating plate 33 by means of a belt and synchronous pulley transmission. In other embodiments, the rotation driving member 34 can also be used to directly coaxially output and drive the rotating plate 33 to rotate. A ventilation hose can be set, in the form of a slip ring, on the axis of the output shaft to design the air path, as shown in FIG. 9.

As shown in FIG. 10, the adhesive tape supporting and winding mechanism 35 includes a fixed support plate 351 fixed on the rotating plate 33, a movable support plate 352 slidably, a fourth cylinder 353 driving the movable support plate 352 to perform a retraction movement, a material clamping plate 354, and a fifth cylinder 355 driving the material clamping plate 354 to perform the material clamping action. The movable support plate 352 is slidably arranged on the rotating plate 33 and arranged opposite to the fixed support plate 351 to form an internal support assembly for adhesive tape winding. The material clamping plate 354 is located between the fixed support plate 351 and the movable support plate 352 and cooperating with the movable support plate 352 or the fixed support plate 351 to clamp the material. The adhesive tape supporting and winding mechanism 35 is located above a front side of the material clamping mechanism 14. After the adhesive tape supporting and winding mechanism 35 moves downward to the set position as a whole, the adhesive tape clamped and torn off by the material clamping mechanism 14 just passes through a space between the material clamping plate 354 and the fixed support plate 351, or between the material clamping plate 354 and the movable support plate 352. Then the material clamping plate 354 performs a material clamping action to clamp the adhesive tape, and then the material clamping mechanism 14 releases the clamping action on the adhesive tape.

The adhesive tape removing and discharging mechanism 36 includes a sixth cylinder 361 fixed on the rotating plate 33, and an adhesive tape removing scraper 362 driven by the sixth cylinder 361 to move up and down. The adhesive tape removing scraper 362 is provided with avoidance notches for the fixed support plate 351, the movable support plate 352 and the material clamping plate 354 to pass through.

In other embodiments, the material receiving assembly 3 may also be, for example, the "material receiving mechanism" in the patent publication No. CN113830386A in the related art.

The adhesive tape tearing process of the adhesive tape tearing module for a double-glass assembly 100 of this embodiment is as follows. In an initial state, the material receiving assembly 3 is located at the upper limit height position. The first transfer driving assembly 2 drives the adhesive tape tearing assembly 1 to move to the edge of one side of the photovoltaic assembly 101, and then the second transfer driving assembly 11 drives the remnant smoothing mechanism 13 to move forward, and the upper and lower smoothing clamping plates 1323 extend to the upper and lower sides of the photovoltaic assembly 101, and then clamp the side edge of the photovoltaic assembly 101. The first transfer driving assembly 2 drives the adhesive tape tearing assembly 1 to move as a whole in the direction towards the adhesive tape remnant 102, the smoothing clamping plates 1323 flattens the adhesive tape remnant 102 to a horizontal state. After the material clamping mechanism 14 moves to the outside of the photovoltaic assembly 101, the movable hook rod 142 retracts to pull the adhesive tape back, and the movable hook rod 142 together with the fixed clamping plate 141 clamps the adhesive tape. The first transfer driving assembly 2 and the second transfer driving assembly 11 cooperate to drive to perform the adhesive tape tearing action at the end. At this time, the remnant smoothing mechanism 13 and the material clamping mechanism 14 retract to the rear side, and the third cylinder 31 is actuated to drive the adhesive tape supporting and winding mechanism 35 and the adhesive tape removing and discharging mechanism 36 to descend to the lower limit height position.

The material clamping plate 354 clamps the adhesive tape, and the movable support plate 352 is in an open state. The first transfer driving assembly 2 drives the material receiving assembly 3 to move as a whole along the side edge of the photovoltaic assembly 101, and the rotating plate 33 rotates at the same time to wind the torn off adhesive tape around the adhesive tape winding support surface. The adhesive tape winding support surface is formed jointly by the movable support plate 352 and the fixed support plate 351. After the adhesive tape on one side is torn off, the material clamping plate 354 releases clamping the adhesive tape, and the sixth cylinder 361 drives the adhesive tape removing scraper 362 to move downward to scrape off the adhesive tape wound around the movable support plate 352 and the fixed support plate 351 to complete the overall adhesive tape tearing.

In this embodiment, the adhesive tape tearing assembly 1 and the material receiving assembly 3 are jointly arranged on the first transfer driving assembly 2. In other embodiments, they can also be separately arranged on a horizontal transfer module to be separately transfer driven horizontally.

Figure 11:
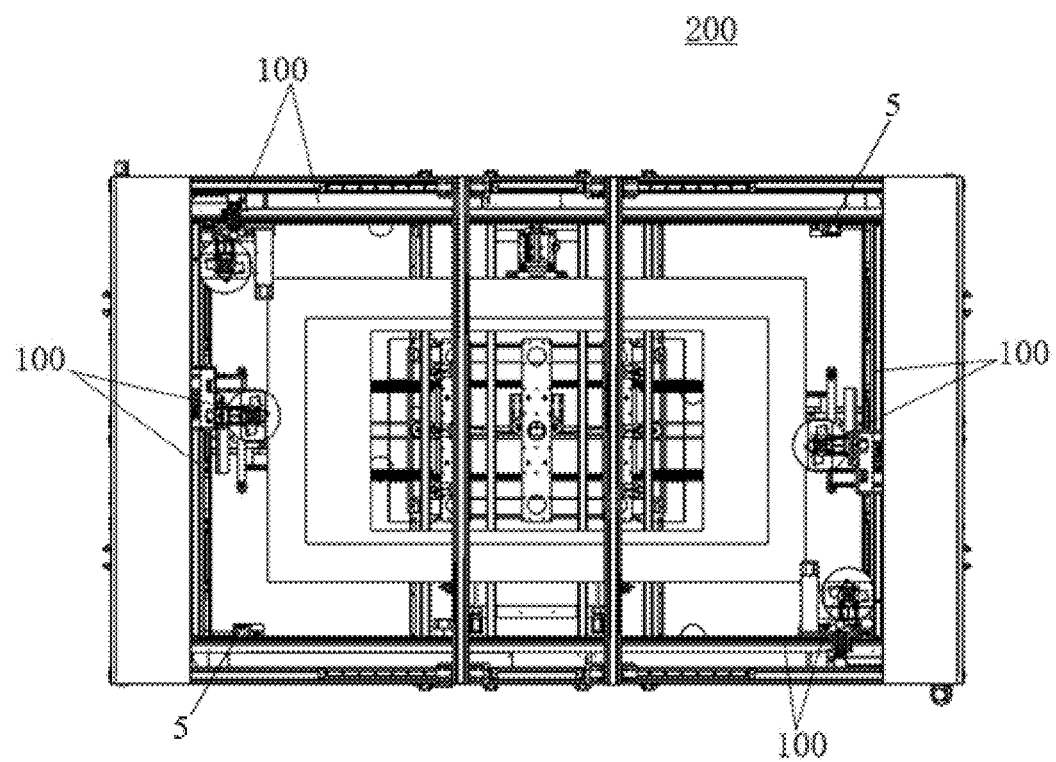
FIG. 11 is a schematic structural diagram of an adhesive tape tearing machine for a double-glass assembly in embodiments of the present application.

Reference is made to FIG. 11, an adhesive tape tearing machine for a double-glass assembly 200 is further provided according to this embodiment, which includes an adhesive tape tearing module for a double-glass assembly 100, and four sets of adhesive tape tearing modules for a double-glass assembly 100 are provided for performing synchronous adhesive tape tearing operations on four sides of the photovoltaic assembly 101 respectively.

Compared with the related art, an adhesive tape tearing module for a double-glass assembly and an adhesive tape tearing machine are provided according to the present application, which are adapted to correcting various adhesive tape remnant postures and can perform effective and reliable automatic adhesive tape tearing actions. Specific aspects are as follows.

1) By providing the remnant smoothing mechanism, two upper and lower smoothing clamping plates with the up-down elastic floating function are used to clamp the upper and lower surfaces of the side of the photovoltaic assembly from inward of the photovoltaic assembly, and flatten the adhesive tape outward in sequence in the direction of the adhesive tape. Before clamping the adhesive tape remnant, the upward or downward curled adhesive tape remnant is flattened to a set state, realizing automatic correction of the upward or downward curled adhesive tape remnant, ensuring that the adhesive tape remnant in such a posture can be clamped accurately and reliably.

2) In conjunction with the remnant smoothing module, a hook-back type material clamping mechanism is provided to clamp the adhesive tape by hooking the material backwards, thus automatically correcting the adhesive tape remnant that curls forward, ensuring that the adhesive tape remnant in this posture category can be clamped accurately and reliably.

3) By providing the rear side baffle at rear of the region between the two smoothing clamping plates, the backward curled adhesive tape remnant can be effectively guided into the smoothing correction range of the two smoothing clamping plates, thereby realizing automatic correction of the backward curled adhesive tape remnant, and ensuring that the adhesive tape remnant in these posture categories can be clamped accurately and reliably. Therefore, no matter in which direction the adhesive tape remnant curls, it can be effectively corrected and accurately clamped, ensuring that the adhesive tape tearing action is carried out stably and reliably.

What is claimed is:

1. An adhesive tape tearing module for a double-glass assembly, comprising an adhesive tape tearing assembly; wherein the adhesive tape tearing assembly comprises:
    a second transfer driving assembly;
    a second support plate, driven by the second transfer driving assembly to move forward and backward; and
    a remnant smoothing mechanism, disposed on the second support plate and configured to flatten an adhesive tape remnant in a direction from inward to outward of a photovoltaic assembly;
    wherein the remnant smoothing mechanism comprises a first cylinder and two smoothing clamping plates which are driven by the first cylinder to perform up-down clamping and have an up-down elastic floating function.

2. The adhesive tape tearing module for the double-glass assembly according to claim 1, wherein a material clamping mechanism is further disposed on the second support plate and is located next to the remnant smoothing mechanism; and in a direction of adhesive tape tearing, the material clamping mechanism is located downstream of the remnant smoothing mechanism.

3. The adhesive tape tearing module for the double-glass assembly according to claim 2, wherein the material clamping mechanism comprises a clamping claw cylinder and clamping claws driven by the clamping claw cylinder to perform up-down clamping and opening actions.

4. The adhesive tape tearing module for the double-glass assembly according to claim 2, wherein the material clamping mechanism comprises a fixed clamping plate fixed on the second support plate, a movable hook rod arranged opposite to the fixed clamping plate, and a second cylinder configured to drive the movable hook rod to move forward and backward to hook a material and cooperate with the fixed clamping plate to clamp the material.

5. The adhesive tape tearing module for the double-glass assembly according to claim 4, wherein a sensor fixing block is disposed on the fixed clamping plate, a sensor is fixedly disposed on the sensor fixing block, and the sensor is configured to detect whether the movable hook rod has pulled the adhesive tape successfully.

6. The adhesive tape tearing module for the double-glass assembly according to claim 1, wherein a rear side baffle is disposed at a rear of a region between the two smoothing clamping plates.

7. The adhesive tape tearing module for the double-glass assembly according to claim 4, wherein a guide vertical plate and a first slide rail which is arranged horizontally from front to back are fixedly disposed on the second support plate, a first slide plate is disposed on the first slide rail, and a piston end of the second cylinder is connected to the first slide plate, a second slide rail arranged vertically is disposed on the first slide plate, and a second slide plate is disposed on the second slide rail, a cam is disposed on the second slide plate, the guide vertical plate is provided with a guide slide groove for the cam to move up and down, and the cam is arranged to extend into the guide slide groove, the movable hook rod is fixed at a front end of the second slide plate and is located at a front side of the fixed clamping plate.

8. The adhesive tape tearing module for the double-glass assembly according to claim 1, further comprising a first transfer driving assembly and a first support plate arranged at a movable end of the first transfer driving assembly, wherein the adhesive tape tearing assembly is arranged on the first support plate and is driven by the first transfer driving assembly to move left and right.

9. The adhesive tape tearing module for the double-glass assembly according to claim 8, further comprising a material receiving assembly; wherein,
the material receiving assembly is arranged on the first support plate and is located above a front side of the adhesive tape tearing assembly; or
the material receiving assembly is driven by a third transfer driving assembly to move left and right.

10. The adhesive tape tearing module for the double-glass assembly according to claim 9, wherein the material receiving assembly comprises a third cylinder fixed on the first support plate, a third support plate driven by the third cylinder to move up and down, a rotating plate rotatably arranged on the third support plate through a rotating shaft, a rotation driving member configured to drive the rotating plate to rotate, an adhesive tape supporting and winding mechanism fixed on the rotating plate, and an adhesive tape removing and discharging mechanism fixed on the rotating plate.

11. The adhesive tape tearing module for the double-glass assembly according to claim 10, wherein the adhesive tape supporting and winding mechanism comprises a fixed support plate fixed on the rotating plate, a movable support plate slidably arranged on the rotating plate and arranged opposite to the fixed support plate to form together with the fixed support plate an internal support assembly for adhesive tape winding, a fourth cylinder configured to drive the movable support plate to perform a retraction movement, a material clamping plate located between the fixed support plate and the movable support plate and cooperating with the movable support plate or the fixed support plate to clamp a material, and a fifth cylinder driving the material clamping plate to perform a material clamping action.

12. An adhesive tape tearing machine for a double-glass assembly, comprising the adhesive tape tearing module for double-glass assembly according to claim 1.

13. The adhesive tape tearing module for the double-glass assembly according to claim 2, wherein a rear side baffle is disposed at a rear of a region between the two smoothing clamping plates.

14. The adhesive tape tearing module for the double-glass assembly according to claim 3, wherein a rear side baffle is disposed at a rear of a region between the two smoothing clamping plates.

15. The adhesive tape tearing module for the double-glass assembly according to claim 4, wherein a rear side baffle is disposed at a rear of a region between the two smoothing clamping plates.

16. The adhesive tape tearing module for the double-glass assembly according to claim 5, wherein a rear side baffle is disposed at a rear of a region between the two smoothing clamping plates.

* * * * *